(12) United States Patent
Shook

(10) Patent No.: US 8,901,995 B2
(45) Date of Patent: Dec. 2, 2014

(54) ACTIVE LOW PASS FILTER

(75) Inventor: Adam L. Shook, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 544 days.

(21) Appl. No.: 12/943,738

(22) Filed: Nov. 10, 2010

(65) Prior Publication Data

US 2012/0112826 A1    May 10, 2012

(51) Int. Cl.
*H03B 1/00* (2006.01)
*H03H 11/12* (2006.01)

(52) U.S. Cl.
CPC .................. *H03H 11/126* (2013.01)
USPC ........................................................ 327/558

(58) Field of Classification Search
USPC ................................................ 327/551–558
See application file for complete search history.

(56) References Cited

U.S. PATENT DOCUMENTS

| | | | |
|---|---|---|---|
| 6,344,773 B1* | 2/2002 | Sevastopoulos et al. | 327/558 |
| 6,369,645 B1* | 4/2002 | Takahashi | 327/558 |
| 7,020,449 B2* | 3/2006 | Shi | 455/234.1 |
| 7,327,997 B2* | 2/2008 | Chandra et al. | 455/307 |
| 7,471,140 B2 | 12/2008 | Salerno | |
| 2008/0204129 A1 | 8/2008 | Le et al. | |
| 2008/0274714 A1* | 11/2008 | Yamaji et al. | 455/341 |

* cited by examiner

*Primary Examiner* — Sibin Chen
(74) *Attorney, Agent, or Firm* — Alan A. R. Cooper; Frederick J. Telecky, Jr.

(57) ABSTRACT

Sallen-Key active low pass filters (LPFs) have been knows for many years; however, these LPFs generally include passive components (i.e., resistors and capacitors) and active components (i.e., amplifiers) that are within the direct signal path that can contribute to the noise at the output of the filter within the pass band. Here, an LPF (which has the same general behavior as a Sallen-Key LPF) has been provided that AC couples passive components and active components to the direct signal path so as to suppress the noise contribution in the pass band.

2 Claims, 2 Drawing Sheets

ACTIVE LOW PASS FILTER

TECHNICAL FIELD

The invention relates generally to an active low pass filter (LPF) and, more particularly, to an active LPF having reduced in-band noise.

BACKGROUND

Turning to FIG. 1, an example of a Sallen-Key LPF 100 can be seen. The LPF 100 generally comprises resistors R1 and R2, capacitors C1 and C2, and amplifier 102. As shown, this LPF 100 is a second order, non-inverting active LPF with the following, simplified (i.e., using an ideal amplifier) transfer function:

$$H(s) = \frac{\frac{\mu}{R_1 R_2 C_1 C_2}}{s^2 + s\left(\frac{1}{R_1 C_1} + \frac{1}{R_2 C_1} + \frac{1}{R_2 C_2}\right) + \frac{1}{R_1 R_2 C_1 C_2}} \quad (1)$$

For LPF 100, it can be seen that there are three main contributors to the output noise, namely, resistors R1 and R2 and amplifier 102. Because both resistors R1 and R2 contribute to the in-band noise at the output, the resistance values for resistor R1 and R2 are generally limited, which may require increased values of capacitors C2 and/or C1 for a given low pass cutoff frequency. This increase in the values of capacitors C2 and/or C1 can result in a significant area penalty. Therefore, there is a need for a filter having reduced in-band noise and having greater flexability than traditionally Sallen-Key LPFs.

Some other conventional circuits are: U.S. Pat. No. 7,471,140; and U.S. Patent pre-Grant Publ. No. 2008/0204129.

SUMMARY

A preferred embodiment of the present invention, accordingly, provides a non-inverting low pass filter (LPF). The LPF comprises a resistor-capacitor (RC) network that receives an input signal, wherein the RC network includes a signal path and a resistor; and an amplifier that is coupled to the RC network, wherein noise from the resistor and the amplifier are suppressed in a pass band.

In accordance with a preferred embodiment of the present invention, the resistor further comprises a first resistor, and wherein the RC network further comprises a second resistor that is located in the signal path.

In accordance with a preferred embodiment of the present invention, the resistor is AC coupled to the signal path.

In accordance with a preferred embodiment of the present invention, the RC network further comprises: a first capacitor that is coupled between the signal path and a first electrode of the resistor; and a second capacitor that is coupled between the signal path and a second electrode of the resistor.

In accordance with a preferred embodiment of the present invention, the amplifier is AC coupled to the signal path.

In accordance with a preferred embodiment of the present invention, the RC network further comprises: a first capacitor that is coupled between the signal path and an input terminal of the amplifier; and a second capacitor that is coupled between the signal path and a output terminal of the amplifier.

In accordance with a preferred embodiment of the present invention, a non-inverting LPF is provided. The LPF comprises a filter input terminal; a filter output terminal; a first resistor that is coupled to the filter input terminal and the filter output terminal; an amplifier having a first input terminal, a second input terminal, and an output terminal; a first capacitor that is coupled between the filter output terminal and the first input terminal of the amplifier; a second capacitor that is coupled between the filter output terminal and the output terminal of the amplifier; and a second resistor that is coupled between the first input terminal of the amplifier and the output terminal of the amplifier.

In accordance with a preferred embodiment of the present invention, the resistance of the second resistor is greater than the resistance of the first resistor.

In accordance with a preferred embodiment of the present invention, the bandwidth of amplifier is greater than the cut off frequency of the LPF.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
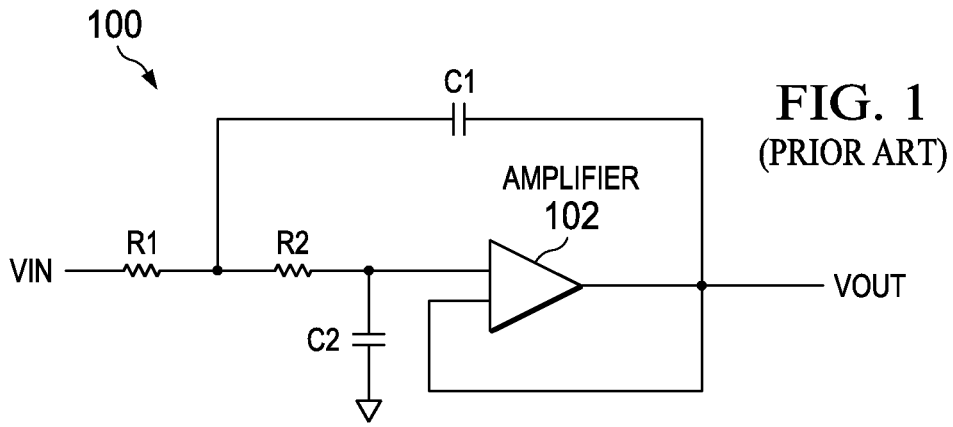
FIG. 1 is a diagram of an example of a conventional Sallen-Key LPF.

Refer now to the drawings wherein depicted elements are, for the sake of clarity, not necessarily shown to scale and wherein like or similar elements are designated by the same reference numeral through the several views.

Figure 2:
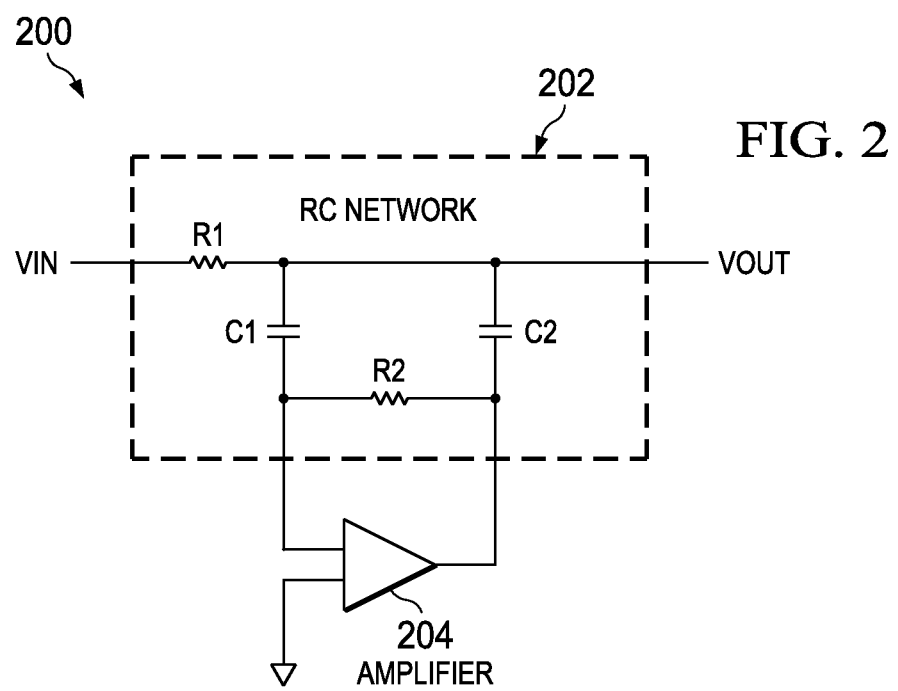
FIG. 2 is a diagram of an example of an active LPF in accordance with a preferred embodiment of the present invention.

Turning to FIG. 2, an example of an active LPF 200 in accordance with a preferred embodiment of the present invention can be seen. As shown, LPF 200 generally comprises a resistor-capacitor (RC) network 102 and an amplifier 102. The RC network 102 also generally comprises resistors R1 and R2 and capacitors C1 and C2. This LPF 200 also has the following, simplified (i.e., using an ideal amplifier) transfer function:

$$H(s) = \frac{1}{s^2 + s\left(\frac{C_1 + C_2}{R_1 C_1 C_2}\right) + \frac{1}{R_1 R_2 C_1 C_2}} \quad (2)$$

Here, resistor R1 is in the direct signal path between the input terminal VIN and output terminal VOUT, while resistor R2 and amplifier 102 are AC coupled to the signal path by capacitors C1 and C2. Thus, in the pass band, the noise contribution from resistor R2 and amplifier 102 is generally suppressed, which allows the size of resistor R2 to be increased with fewer noise penalties and reduces any noise requirements for amplifier 102. Additionally, the output swing, input common mode, and offset of amplifier 102 can also be decoupled due to the AC coupled of amplifier 102 to the direct signal path, which allows the amplifier to be powered by an alternative supply. The amplifier 102 also generally has a bandwidth of greater than the cut off frequency of the filter. Overall, LPF 200 results in a significant amount of area and power savings.

Figure 3:
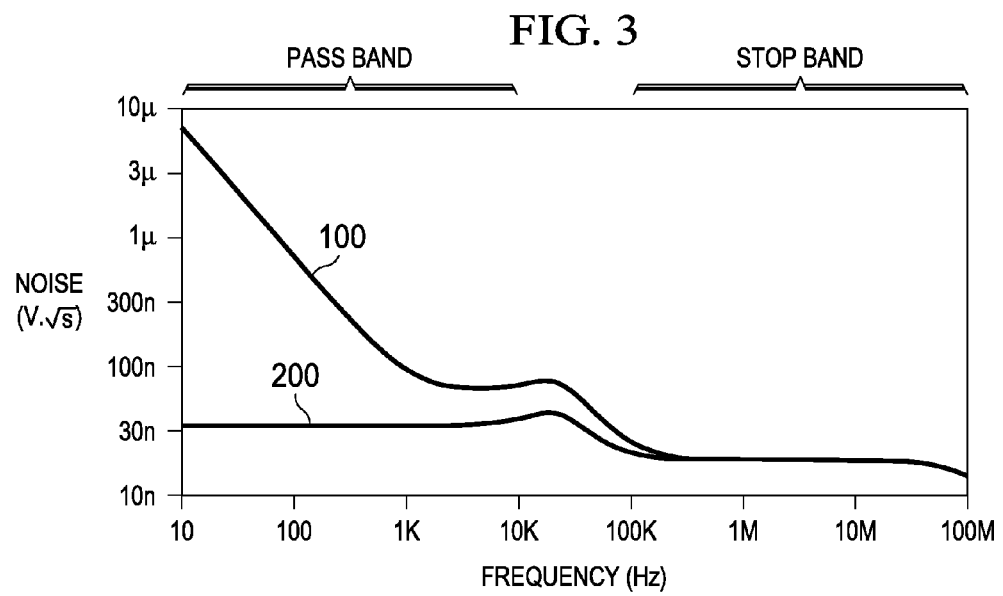
FIG. 3 is a diagram depicting a comparison of the noise responses for the LPFs of FIGS. 1 and 2.

To illustrated the behaviors of LPFs 100 and 200, a diagram can be seen in FIG. 3 that shows a comparison of the noise responses for LPFs 100 and 200. In Table 1, below the characteristics for each of LPFs 100 and 200 used in this example comparison can be seen.

TABLE 1

|  | LPF 100 | LPF 200 |
| --- | --- | --- |
| Resistor R1 | 100 kΩ | 65 kΩ |
| Resistor R2 | 100 kΩ | 135 kΩ |
| Capacitor C1 | 100 pF | 74 pF |
| Capacitor C2 | 48 pF | 74 pF |
| Cutoff Freq. | 22.97 kHz | 22.96 kHz |
| Q | 0.722 | 0.721 |

As shown, the cutoff frequency and Q for each of LPFs 100 and 200 is about the same, while the combined resistance (R1+R1) for each of LPFs 100 and 200 is 200 kΩ and the combine capacitance (C1+C2) for each of LPFs 100 and 200 is 148 pF. Looking to the diagram of FIG. 3, LPF 100 is substantially noisier than LPF 200 between about 10 Hz and 100 kHz. This larger amount of noise for LPF 100 can be principally attributed to the 1/f noise of amplifier 102, which is within the direct signal path of LPF 100, while the noise contribution of LPF 200 for this range can be principally attributed to the thermal noise from resistor R1. At about the cutoff frequency for each of LPFs 100 and 200 there is a noise contribution from each of resistors R1 and R2; however, noise contribution for resistor R2 of LPF 100 is greater than the resistor R2 of LPF 200. Additionally, above 100 kHz (which is in the stop band for each of LPFs), the principal noise contribution is from amplifier 102, which generally match one another. Thus, LPF 200 has significantly lower noise in its pass band than LPF 100 in this example.

Figure 4:
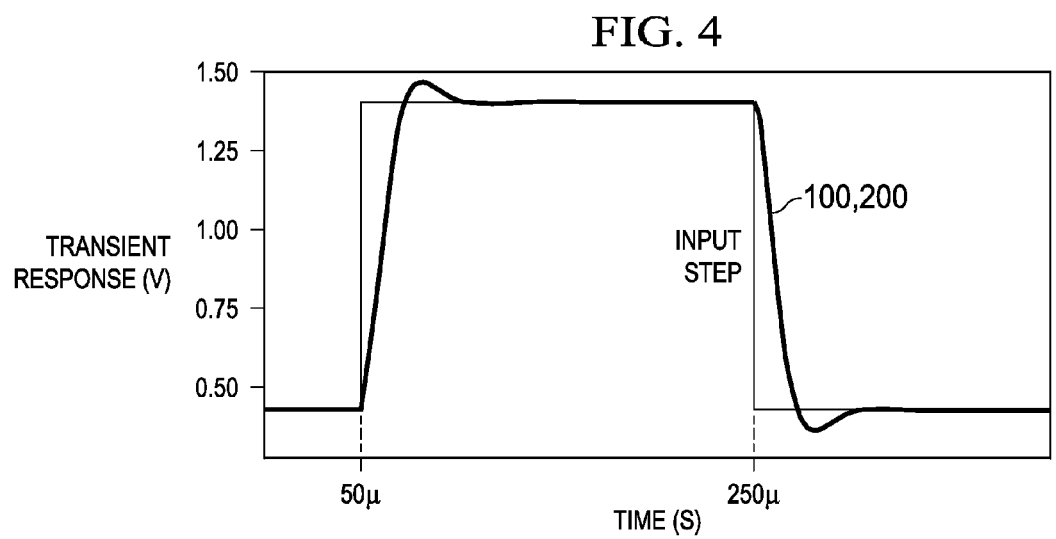
FIG. 4 is a diagram depicting a comparison of the transient responses for the LPFs of FIGS. 1 and 2.

Turning now to FIG. 4, transient responses for LPF 100 and 200 can be seen. For this example, each of LPFs 100 and 200 uses the characteristics illustrated in Table 1 above. As shown for the input step between 50 μs and 250 μs, the transient responses for LPFs 100 and 200 overlay one another, meaning that the transient responses for LPFs 100 and 200 are about the same.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. A non-inverting LPF comprising:
   a filter input terminal;
   a filter output terminal;
   a first resistor that is coupled to the filter input terminal and the filter output terminal, wherein the first resistor has a first resistance;
   an amplifier having a first input terminal, a second input terminal, and an output terminal;
   a first capacitor that is coupled between the filter output terminal and the first input terminal of the amplifier;
   a second capacitor that is coupled between the filter output terminal and the output terminal of the amplifier; and
   a second resistor that is coupled between the first input terminal of the amplifier and the output terminal of the amplifier, wherein the second resistor has a second resistance, and wherein second resistance is greater than the first resistance.

2. The non-inverting LPF of claim 1, wherein the bandwidth of amplifier is greater than the cutoff frequency of the LPF.

* * * * *